US012666735B2

(12) United States Patent　　(10) Patent No.:　　US 12,666,735 B2
Zang et al.　　　　　　　　　　　　(45) Date of Patent:　　Jun. 23, 2026

(54) VERTICAL TRANSFER GATE DOPING DISTRIBUTION FOR CHARGE TRANSFER FROM A PHOTODIODE

(71) Applicant: OMNIVISION TECHNOLOGIES, INC., Santa Clara, CA (US)

(72) Inventors: Hui Zang, San Jose, CA (US); Vincent Venezia, Los Gatos, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 515 days.

(21) Appl. No.: 18/180,037

(22) Filed: Mar. 7, 2023

(65) Prior Publication Data

US 2024/0304638 A1　　Sep. 12, 2024

(51) Int. Cl.
　　*H10F 39/00*　　(2025.01)
　　*H10F 39/18*　　(2025.01)

(52) U.S. Cl.
　　CPC ..... *H10F 39/80373* (2025.01); *H10F 39/014* (2025.01); *H10F 39/028* (2025.01); *H10F 39/18* (2025.01)

(58) Field of Classification Search
　　CPC ............. H10F 39/80373; H10F 39/014; H10F 39/028; H10F 39/18; H10F 39/8033; H10F 39/80377; H04N 25/77; H04N 25/76; H04N 25/772; H04N 25/78
　　See application file for complete search history.

(56) References Cited

U.S. PATENT DOCUMENTS

| 2009/0250734 | A1* | 10/2009 | Palsule ................... | H10F 39/80 |
| | | | | 257/292 |
| 2020/0411585 | A1* | 12/2020 | Huang ................... | H10F 39/805 |
| 2021/0074758 | A1* | 3/2021 | Takahashi ........... | H10F 39/8063 |
| 2022/0059600 | A1* | 2/2022 | Wang ............... | H10F 39/80377 |
| 2022/0320154 | A1* | 10/2022 | Tsai ....................... | H10F 39/807 |
| 2024/0072082 | A1* | 2/2024 | Cheng ................... | H10F 39/014 |

* cited by examiner

*Primary Examiner* — Ratisha Mehta
*Assistant Examiner* — Sophia W Kao
(74) *Attorney, Agent, or Firm* — Dorsey & Whitney LLP

(57)　　　　ABSTRACT

A pixel cell includes a photodiode disposed in a semiconductor material. A floating diffusion is disposed in the semiconductor material. A transfer gate includes a vertical transfer gate structure disposed in the semiconductor material between the photodiode and the floating diffusion. The transfer gate is coupled between the photodiode and the floating diffusion. A passivation layer is disposed in the semiconductor material and proximate to the vertical transfer gate. The passivation layer has a region with a non-uniformly distributed doping profile proximate to the vertical gate structure such that a first doping concentration of the region in the passivation layer proximate to the vertical gate structure along a first direction is less than a second doping concentration of the region in the passivation layer proximate to the vertical gate structure along a second direction.

21 Claims, 7 Drawing Sheets

100

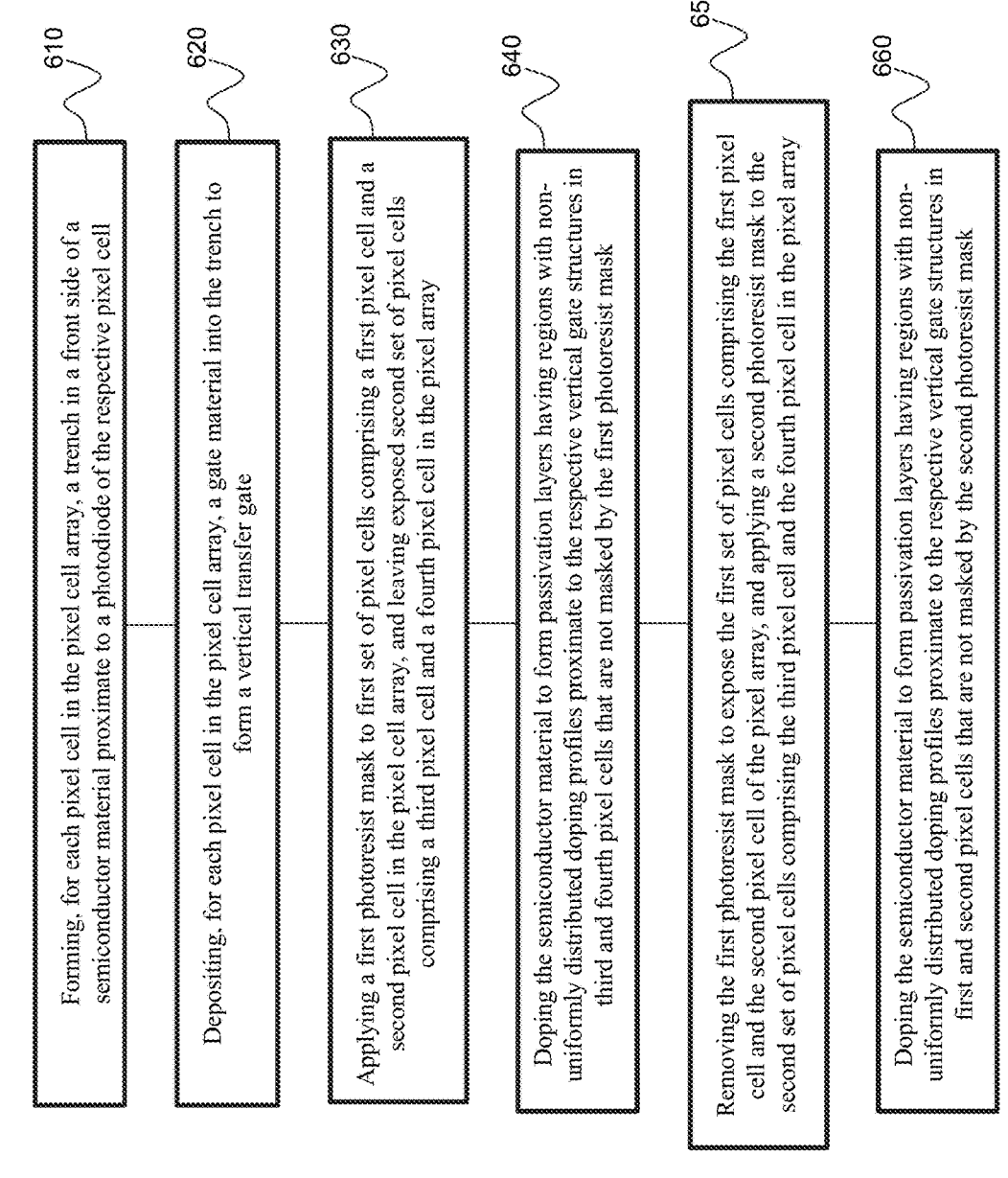

600

610 Forming, for each pixel cell in the pixel cell array, a trench in a front side of a semiconductor material proximate to a photodiode of the respective pixel cell 620 Depositing, for each pixel cell in the pixel cell array, a gate material into the trench to form a vertical transfer gate 630 Applying a first photoresist mask to first set of pixel cells comprising a first pixel cell and a second pixel cell in the pixel cell array, and leaving exposed second set of pixel cells comprising a third pixel cell and a fourth pixel cell in the pixel array 640 Doping the semiconductor material to form passivation layers having regions with non-uniformly distributed doping profiles proximate to the respective vertical gate structures in third and fourth pixel cells that are not masked by the first photoresist mask 650 Removing the first photoresist mask to expose the first set of pixel cells comprising the first pixel cell and the second pixel cell of the pixel array, and applying a second photoresist mask to the second set of pixel cells comprising the third pixel cell and the fourth pixel cell in the pixel array 660 Doping the semiconductor material to form passivation layers having regions with non-uniformly distributed doping profiles proximate to the respective vertical gate structures in first and second pixel cells that are not masked by the second photoresist mask

FIG. 6

VERTICAL TRANSFER GATE DOPING DISTRIBUTION FOR CHARGE TRANSFER FROM A PHOTODIODE

TECHNICAL FIELD

The present disclosure relates generally semiconductor processing. More specifically, examples of the present disclosure are related to semiconductor processing of image sensor pixel cells.

BACKGROUND

An image capture device includes an image sensor and an imaging lens. The imaging lens focuses light onto the image sensor to form an image, and the image sensor converts the light into electric signals. The electric signals are output from the image capture device to other components of a host electronic system. The electronic system may be, for example, a mobile phone, a computer, a digital camera or a medical device.

There is a continuing demand to reduce the size of image sensors, which results in the smaller pixel cells for an image sensor with the same resolution. As the sizes of pixel cells continue to decease, the issue of pixel cell crosstalk and unwanted signal transfer between pixel cells continues to become a growing challenge. Pixel cells that can accommodate a wider dynamic range of optical signals are needed. Furthermore, as image sensors are miniaturized, the pixel cells contained therein suffer from increased dark current rates.

BRIEF DESCRIPTION OF THE DRAWINGS

Non-limiting and non-exhaustive embodiments of the present disclosure are described with reference to the following figures, wherein like reference numerals refer to like parts throughout the various views unless otherwise specified.

FIG. 6 shows an example process for producing the image sensor devices in accordance with the teachings of the present disclosure.

Figure 1:
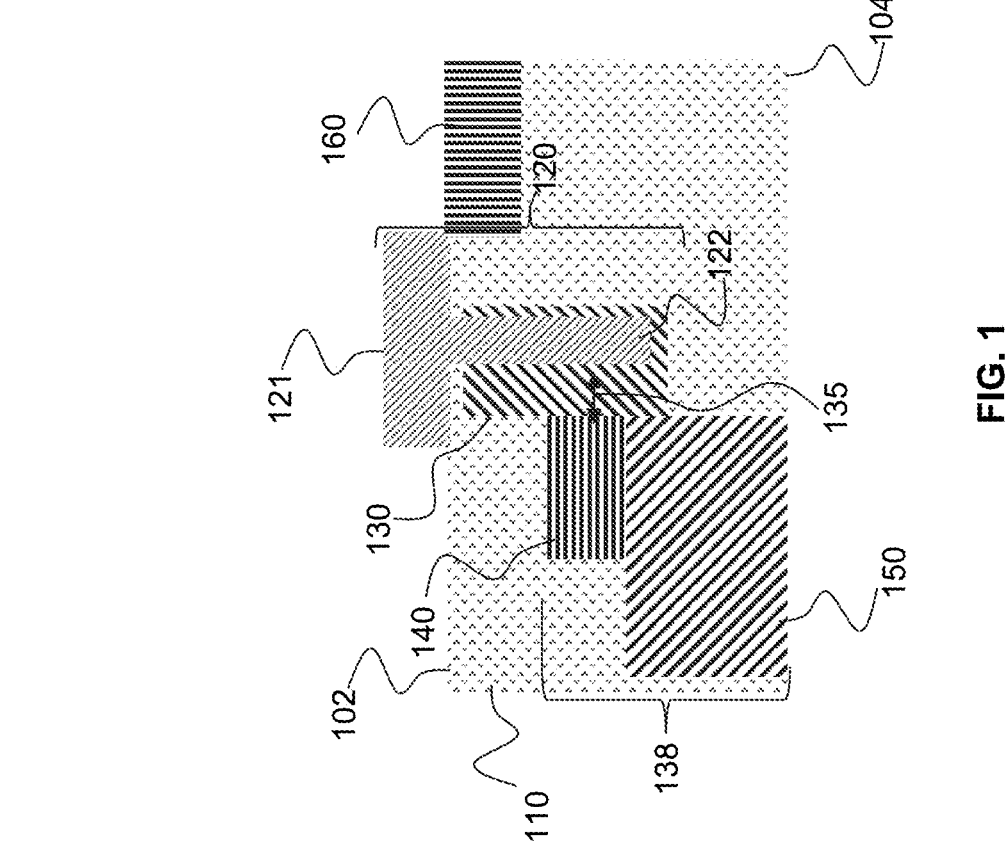
FIG. 1 depicts an example cross-sectional view (semiconductor material depth vs. one lateral dimension) of a pixel cell that may be included in an example four-cell pixel unit.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

Examples in accordance with the disclosed subject matter include a pixel cell with a transfer gate including a vertical transfer gate with a non-uniform doping profile in a semiconductor material. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present disclosure. Thus, the appearances of the phrases "in one example" or "in one embodiment" in various places throughout this specification are not necessarily all referring to the same example. Furthermore, the particular features, structures, or characteristics may be combined in any suitable manner in one or more examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, in various examples, a vertical transfer gate lies between a corresponding photodiode and a floating diffusion. A non-uniform doping profile has a doping concentration in a first area or a first direction that is less than the doping concentration in a second area or second direction. During the charge transfer time period, charges are transferred through the semiconductor material along a charge transfer path between the photodiode and the floating diffusion along a major axis of the second area that is parallel to the second direction.

To illustrate, FIG. 1 depicts an example cross-sectional view (semiconductor material depth vs. one lateral dimension) of a pixel cell 100 that may be included in an example four-cell pixel unit in accordance with an embodiment of the present disclosure. Pixel cell 100 includes semiconductor material 110 such as silicon, photodiode region 138, transfer gate 120, and floating diffusion 160. The semiconductor material 110 has a frontside surface 102 and a backside surface 104 opposite to frontside surface 102. Photodiode region 138 includes a shallow n-type doped photo diode (NPPD) region 140 and a deep n-type doped photodiode region (DNPPD) 150 disposed in the semiconductor material 110 between frontside surface 102 and backside surface 104. Deep n-type doped photodiode region 150 abuts the shallow n-type doped photodiode (NPPD) region 140. Transfer gate 120 includes a planar gate portion 121 on frontside surface 102 and a vertical transfer gate (VTG) 122 extended into the semiconductor material 110 proximate to shallow NPPD region 140. Lying between VTG 122 and NPPD region 140/DNPPD region 150 is a doped material 130 has a thickness, d, shown at 135. Doped material 130 is a region in the semiconductor material 110 doped with dopant having an opposite conductivity type as the photodiode, such as P-type. The planar gate portion 121 and the VTG 122 of the transfer gate 120 control the transfer of charge from the photodiode region 138 to the floating diffusion 160 in the semiconductor material 110. The doped material 130 has a non-uniform doping profile in the regions surrounding the VTG 122 providing surface passivation improving dark current and at the same time minimizes its impact on charge transfer efficiency, e.g., reduces a potential barrier associated with the charge transfer channel, which is formed by the transfer gate 120. In various embodiments, during the charge transfer period, one or more charges can be transferred through the semiconductor material along a charge transfer path direction.

In some example embodiments, the doped material 130 of the semiconductor material 110 is disposed proximate to VTG 122 providing surface passivation to reduce dark current and white pixels induced by defects proximate to sidewall surfaces of vertical transfer gate VTG 122. In some example, the dopant used to form the doped material 130 is boron. A high concentration of boron, such as greater 1E16 ions per cm$^3$ in the doped material 130, can induce a sufficient potential barrier impeding charge transfer which can degrade charge transfer efficiency. As the doping concentration of doped material 130 decreases lowering potential barrier, the amount of charge transfer time can be shortened and charge transfer time lag can be reduced. Doping concentration is adjusted to optimize the charge transfer efficiency, charge transfer time, and image lag. The disclosed non-uniform passivation doping distribution of doped material 130 improves charge transfer and reduces image lag while maintaining dark current performance.

Figure 2A:
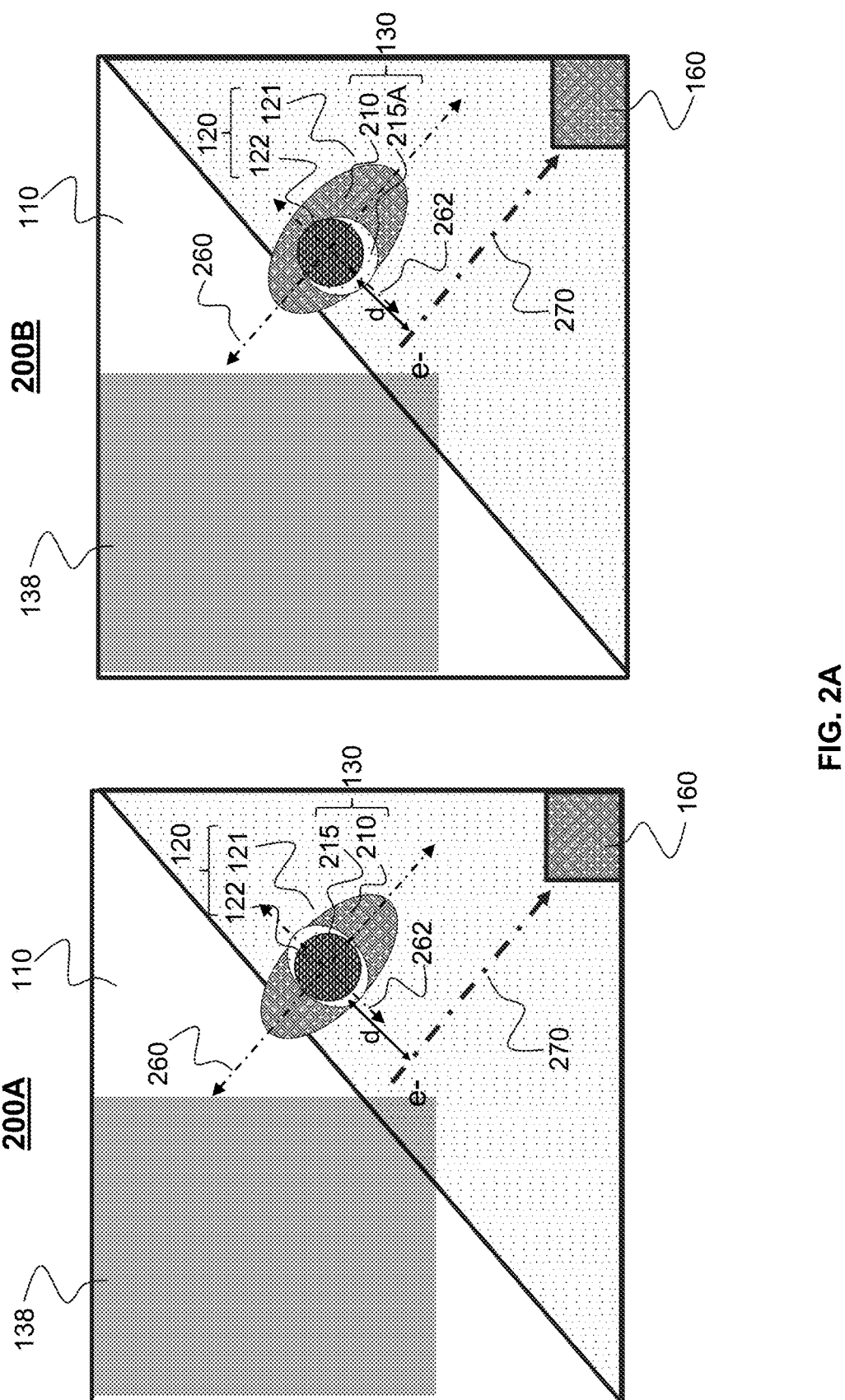
FIG. 2A depicts examples of top-views of pixel cells with different doping concentrations in different areas, in accordance with some example embodiments.

FIG. 2A depicts examples of top views (semiconductor material lateral dimensions) of pixel cells 200A and 200B. Similar to FIG. 1, pixel cell 200A shows semiconductor material 110 with photodiode region 138, transfer gate 120 with planar gate portion 121 and vertical transfer gate 122, and floating diffusion 160. Pixel cell 200A includes a passivation layer provided by the non-uniform doping profile of doped material 130 in semiconductor material 110 underneath planar gate portion 121 in proximity to vertical transfer gate 122. In embodiments, passivation layer provided by doped material 130 may surround vertical transfer gate 122. Thus, in embodiments, the passivation layer is a doped region within semiconductor material 110, i.e., the passivation layer is part of semiconductor material 110. Vertical transfer gate 122 may be of a pillar-shaped.

In the example depicted in FIG. 2, the passivation layer is formed with the doped material 130 that includes doped regions 210 and 215, which have non-uniform or different doping concentrations. For example, the doping concentration in doped region 210 can be higher than the doping concentration in doped region 215. In embodiments, doped region 210 may have a concentration ranging on the order between 1E16 ions per cm$^3$ to 1E19 ions per cm$^3$. In some embodiments, doped region 215 has concentration that is at least 20% lower than that of doped region 210. Doped regions 210 and 215 surround vertical transfer gate 122. In some embodiments, doped region 210 may have concentration greater 1E16 ions per cm$^3$. In some embodiments, doped regions 210 and 215 surround and enclose vertical transfer gate 122.

In various examples, doped regions 210 and 215 have predetermined shapes and sizes relative to one another. As will be discussed, the top view cross-section illustration of the example doped regions 210 and 215 shown in FIG. 2A depict a non-uniformly distributed doping profile proximate to the vertical gate structure 122 with oval shaped profiles. In particular, doped region 210 can have an elliptical shape with a major axis 260 oriented parallel to a direction of a main charge transfer path 270 between photodiode 138 and floating diffusion 160. Continuing the example, doped region 215 can also have an elliptical shape. Doped region 215 may be disposed entirely within doped region 210 or may disposed partially inside doped region 210. In some example embodiments, a major axis 262 of an elliptical-shaped doped region 215 is orthogonal to a major axis 260 of elliptical-shaped doped region 210. As such, in some embodiments, a minor axis of elliptical-shaped doped region 210 is parallel with the major axis 262 of the elliptical-shaped doped region 215, while a minor axis of the elliptical-shaped doped region 215 is parallel with the major axis 260 of elliptical-shaped doped region 210.

In some embodiments, the major axis 262 intersects with main charge path 270 and the major axis 260 is parallel with main charge path 270. In some embodiments, the major axis 262 of the elliptical-shaped doped region 215 may be oriented at an angle relative to the major axis 260 of an elliptical doped region 210 that is different from orthogonal (e.g., 30, 45, 60, or 80 degrees). In some embodiments, the shape of each of doped regions 210 and 215 is oval shaped, rectangular shaped, or diamond shaped. In some embodiments, the higher doping concentration in doped region 210 (compared to doped region 215) is with a major axis (e.g., major axis 260) parallel to a line from the center of doped region 210 to the center of floating diffusion 160 or parallel to the direction of the flow of charges along the direction of main charge transfer path 270 between photodiode 138 and floating diffusion 160. In some alternative embodiments, the doping concentration in doped region 215 can be higher than the doping concentration in doped region 210.

In some embodiments, the doping concentration in doped region 215 may be varying with respect to region position from the main charge transfer path 270. For example, the doping concentration in doped region 215 increases as the distance d from the main charge transfer path 270 increases. The doping concentration of doped region 215 may have a gradient concentration distribution that increases as the distance d between doped region 215 and the main charge transfer path increases.

Referring to FIG. 1, doped material 130 proximate to the side of the VTG 122 lying along a charge transfer direction from the VTG 122 to the floating diffusion 160 is implanted with a reduced Boron doping to lower the potential barrier height in the region between the photodiode (shallow NPPD region) and the transfer channel associated with the VTG 122, where most of the electrons from the photodiode are aggregated and transferred to the floating diffusion. Doped material 130 proximate to the side of the VTG 122 in, for example, a direction orthogonal or nearly orthogonal to the charge transfer direction from the VTG 122 to the floating diffusion is implanted with an increased Boron doping account for the surface passivation.

Referring back to FIG. 2A, doped region 215 is configured to have a concentration less than the doped region 210. For example, doped region 215 can be implanted at a dosage that is 20-70% less than a dosage used for doped region 210. For example, the doped region 215 can be 30% of the doping concentration in doped region 210. The asymmetric doping in doped regions 210 and 215 can be formed using the same mask with suitable implant dose and tilt implant angle configuration. As a result, the higher doping in doped region 210 with an elliptical shape is aligned with its major axis 260 parallel to a direction of charge flow from the photodiode region 138 to floating diffusion 160 and lower doping in doped region 215. In some embodiments, the major axis 260 of doped region 210 having higher concentration is parallel to the main charge transfer flow while the major axis 262 of the doped region 215 having lower concentration is perpendicular the main charge transfer flow. As such, the adverse effect of passivation doping for vertical transfer gate 122 on charge transfer can be reduced.

Similar to pixel cell 200A, pixel cell 200B shows semiconductor material 110 with photodiode region 138, transfer gate 120 with planar gate portion 121 and vertical transfer gate 122, and floating diffusion 160. Pixel cell 200B includes doped regions 210 and 215A. Doped region 210 is the same as shown in 200A. Doped region 215A has asymmetrical doping distribution. Doped region 215A the same doping concentration as doped region 215 but with a different shape than doped region 215 in 200A. The shape of doped region 215A extends away from VTG 122 in one direction but not in the opposite direction away from VTG 122. Doped region 215A, where there is reduced doping compared to doped region 210, is located only near the charge transfer region between the photodiode region 138 and VTG 122 and does not extend in the opposite direction away from photodiode region 138. Doped region 215A may provide better surface passivation and white pixel performance. For example, improved surface passivation can reduce the chemical reactivity of the semiconductor material surface and eliminate dangling bonds and other defects that form electronic surface states, which can impair performance of semiconductor devices.

In some example embodiments, a blooming doping region (not shown) in the semiconductor material can be added in the region between the photodiode region 138 and the floating diffusion 160 except in the doped regions 210 and 215/215A shown in FIG. 2A. The blooming doping is used for transfer gate off leakage control. The doping concentration in the blooming region is lower than the doping concentrations in doped regions 210 and 215/215A.

Figure 2B:
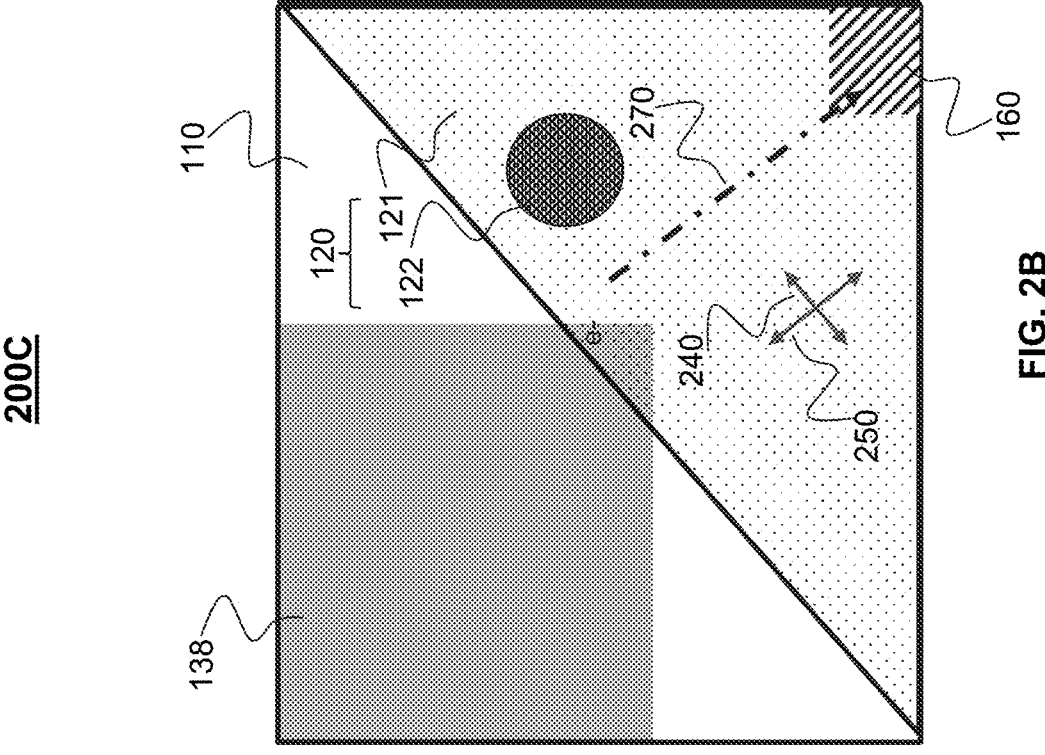
FIG. 2B depicts an example pixel cell similar to the pixel cell in FIG. 2A except the doping is greater in a first direction than in a second direction orthogonal to the first direction in accordance with the teachings of the present disclosure.

FIG. 2B shows pixel cell 200C which is similar to 200A and 200B except instead of doped regions with specific shapes such as elliptical or oval or another shape, the dosage used to implant the doped region is lower in a first direction 240 than in a second direction 250 orthogonal to the first direction 240. Pixel cell 200C includes semiconductor material 110 with photodiode region 138, transfer gate 120 with planar gate portion 121 and vertical transfer gate 122, and floating diffusion 160. Pixel cell 200C includes a first doping concentration in first direction 240 and a second doping concentration in second direction 250. The doping concentration can be lower in first direction 240 than in the orthogonal second direction 250 wherein the second direction 250 runs in a direction parallel to direction from the corresponding photodiode region 138 towards the floating diffusion 160, and the first direction runs in a direction perpendicular to direction charge flow from photodiode region 138 towards the floating diffusion 160.

Figure 3:
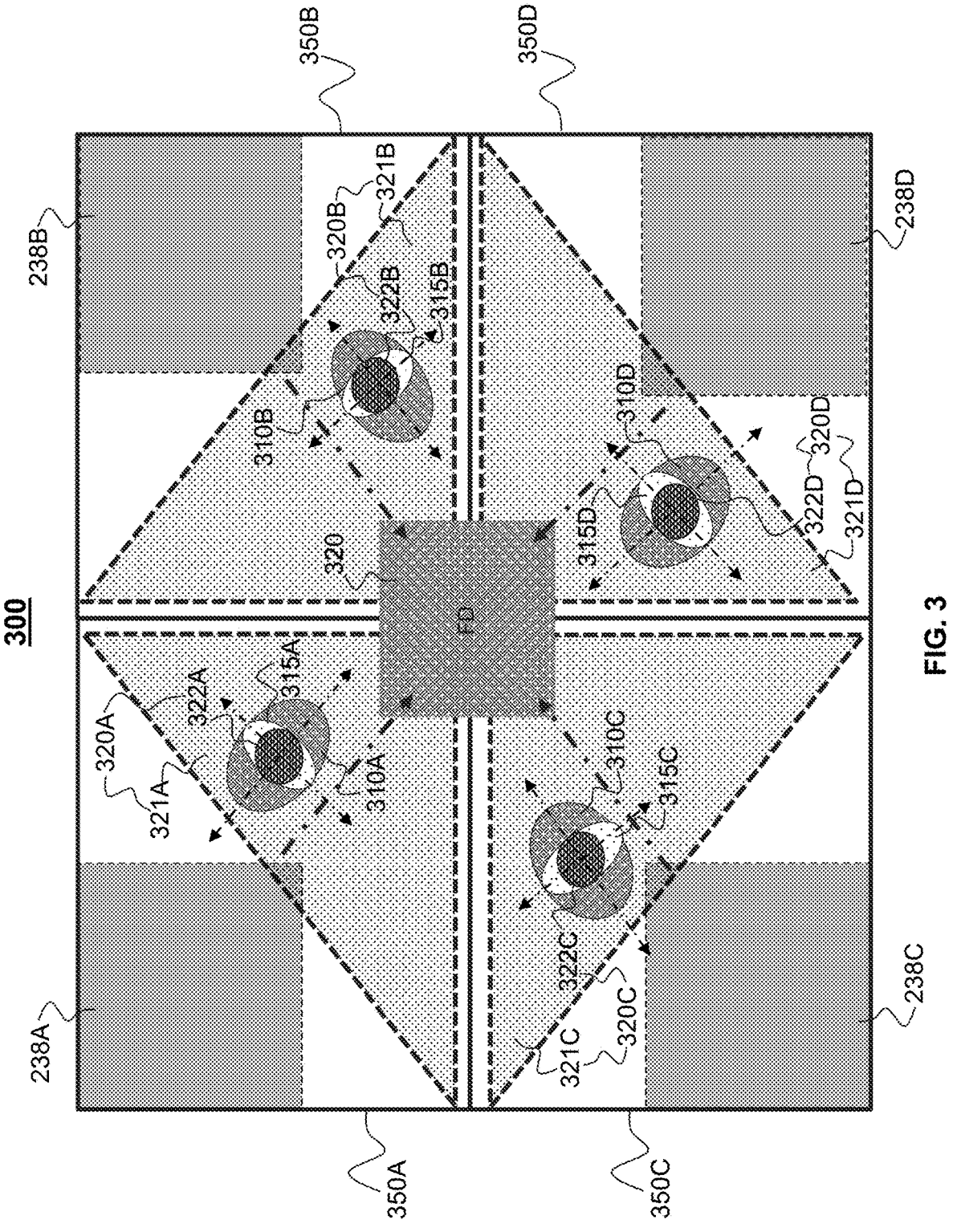
FIG. 3 shows an example pixel unit including four pixel cells connected to a single floating diffusion in accordance with the teachings of the present disclosure.

FIG. 3 shows a pixel cell unit 300 including four pixel cells 350A-350D connected to a floating diffusion 320. Each pixel cell is a pixel cell as described above with respect to FIGS. 1, 2A and 2B, except in FIG. 3, the photodiodes of four pixel cells 350A-350D included in the pixel cell unit 300 are coupled to a shared or common floating diffusion 320 through respective transfer gate instead of different floating diffusions for each pixel cell. Pixel cells 350A-350D include photodiodes 238A-238D, doped regions 310A-310D and 315A-315D, and transfer gates 320A-320D. In the example, transfer gate 320A includes planar transfer gate 321A and vertical transfer gate 322A, transfer gate 320B includes planar transfer gate 321B and vertical transfer gate 322B, transfer gate 320C includes planar transfer gate 321C and vertical transfer gate 322C, and transfer gate 320D includes planar transfer gate 321D and vertical transfer gate 322D. In the example, the doped regions 310A-310D and doped regions 315A-315D are depicted with elliptical shapes. Similar to the examples depicted in FIG. 2A, the major axis of each of the depicted elliptical shapes corresponding to the doped regions 310A-310D and doped regions 315A-315D is illustrated with a respective dashed line.

As shown in the example depicted in FIG. 3, each of photodiodes 238A-238D is coupled to the floating diffusion 320 through respective transfer gates 320A-320D. For example, photodiode 238A is coupled to floating diffusion 320 through transfer gate 320A. Photodiode 238B is coupled to floating diffusion 320 through transfer gate 320B. Photodiode 238C is coupled to floating diffusion 320 through transfer gate 320C. Photodiode 238D is coupled to floating diffusion 320 through transfer gate 320D.

As illustrated in the depicted example, the major axes of doped regions 310A and 310D as well as the major axes of doped regions 315B and 315C have the same orientations due to the symmetric arrangement of the pixel cells within the pixel cell unit 300. By having same orientations, doped regions 310A and 310D can be implanted in the same implantation process step with same implantation configuration (e.g., dosage, implantation energy, and/or implantation angle) in a direction parallel to respective main charge transfer path from photodiode 238A to floating diffusion 320 or from photodiode 238D to floating diffusion 320. Similarly, doped regions 315B and 315C can be formed in the same implantation process step. In some embodiments, doped regions 310A and 310D as well as doped regions 315B and 315C can be implanted in the same process step, with less dosage being used to form regions 315B and 315C.

Similarly, as illustrated in the depicted example, the major axes of doped regions 310B and 310C as well as the major axes of doped regions 315A and 315D have the same orientations. As such, doped regions 310B and 310C as well as doped regions 315A and 315D are formed in the same implantation process step. Doped regions 310B and 310C as well as doped regions 315A and 315D can be doped in the same process step, with lower dosage being used to implant in regions 315A and 315D. Note that in the illustrated example, the orientations of doped regions 315A and 315D are orthogonal to the orientations of doped regions 315B and 315C, and the orientations of doped regions 310A and 310D are orthogonal to the orientations of doped regions 310B and 310C. As shown in the depicted example, doped regions 315A-315D and 310A-310D are oriented such that doped regions 310A-310D with higher dosages do not intersect with main charge transfer path formed by respective transfer gate between corresponding photodiodes 238A-238D to flow towards floating diffusion 320.

Figure 4:
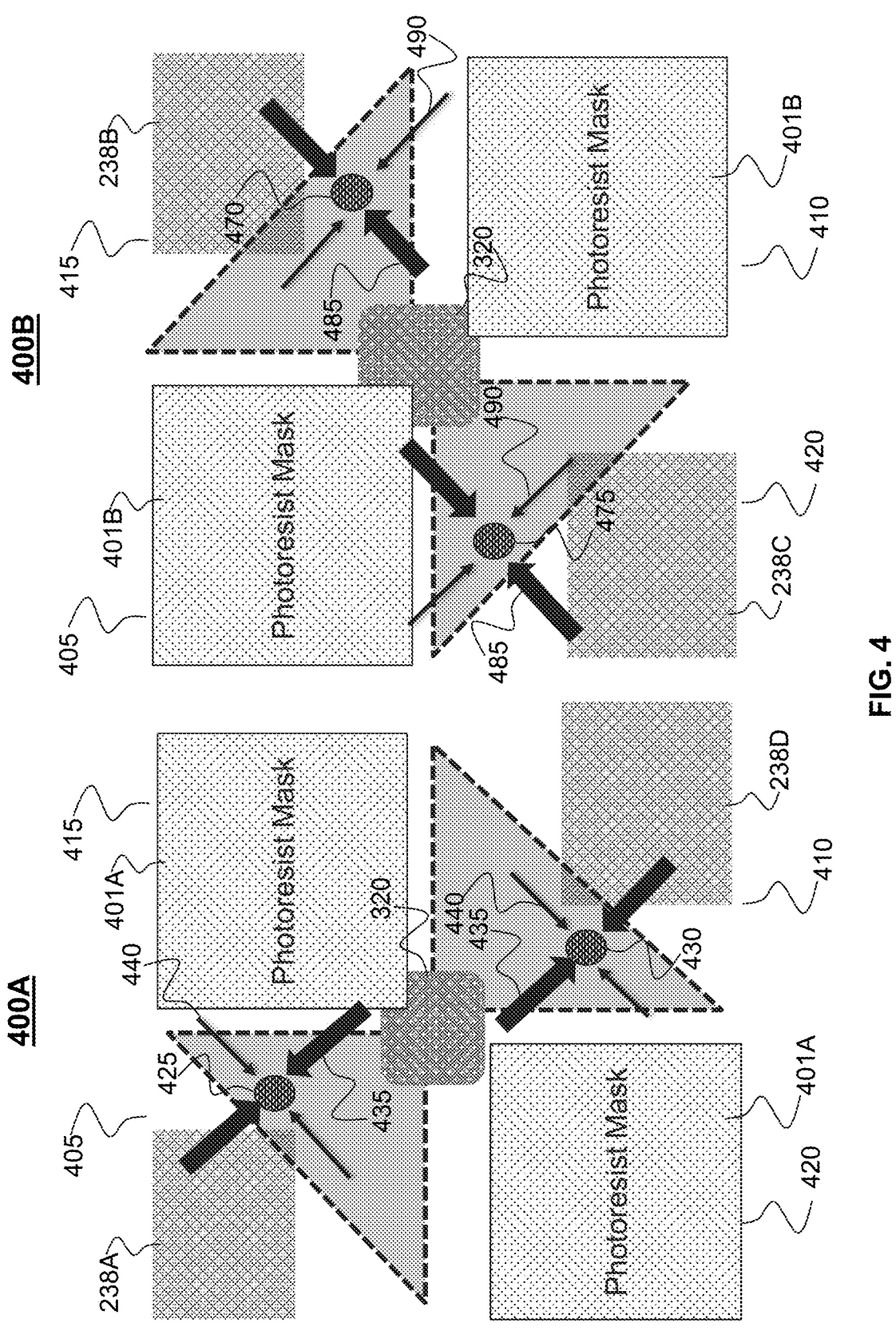
FIG. 4 shows example pixel units at different stages of fabrication that include a photoresist covering first pixels and not second pixels at a first fabrication step, and covering the second pixels and not the first pixels in a second fabrication step in accordance with the teachings of the present disclosure.

FIG. 4 shows pixel cell units 400A and 400B at different stages of fabrication. Each of pixel cell units 400A, 400B includes pixel cells 405, 410, 415, and 420. Photodiodes in pixel cells 405, 410, 415, and 420 may be coupled to a common floating diffusion. As shown at the stage of fabrication pixel cell unit 400A, a first photoresist mask 401A is applied over a first set of pixel cells including two pixel cells 415 and 420, and exposing a second set of pixel cells including two pixel cells 405 and 410 as shown in pixel cell unit 400A. The first set of pixel cells, e.g., pixel cells 415 and 420 as illustrated, have the same orientation of major doping direction 485 (e.g., for doping doped regions 310B and 310C as shown in FIG. 3) and minor doping direction 490 (e.g., for doping doped regions 315B and 315C as shown in FIG. 3). The exposed second set of pixel cells, e.g., two pixel cells 405 and 410 as illustrated have the same major doping direction 435 (e.g., for doping doped regions 310A and 310D as shown in FIG. 3) and minor doping direction 440 (e.g., for doping doped regions 315A and 315D as shown in FIG. 3). In the example, the doping concentration in the major directions 435, 485 is higher than the doping concentration in the minor directions 440, 490. For example, the doping concentration in the minor direction 440, 490 can be 20%-70% of the doping concentration in the major direction 435, 485. In some example embodiments, each pixel cell 405, 410, 415, 420 of a pixel cell unit is similar to FIG. 2B. For example, a pixel cell unit at the stage of fabrication shown by pixel cell unit 400A has a photoresist mask overlay and cover over a first set of pixel cells, including pixel cells 415 and 420, and a second set of pixel cells, including pixel cells 405 and 410, do not have any part of the photoresist mask covering them, which enables subsequent implantation processing. In the example at 400A, a doping process implants a higher dopant concentration in direction 435 and a lower dopant concentration in direction 440. The dosage for higher dopant concentration may range between 1E13 ions/cm² to 1E14 ions/cm². At the stage of fabrication at 400A, no doping is performed at the first set of pixel cells, including pixel cells 415 and 420.

At another stage of fabrication shown by pixel cell unit 400B, the first photoresist mask 401A is removed exposing the first set of pixel cells, including two pixel cells 415 and 420, and a second photoresist mask 401B is deposited covering the second set of pixel cells, including pixel cells 405 and 410. In the example at 400B, a doping process implants a higher dopant concentration in direction 485 and a lower dopant concentration in direction 490. At the stage of fabrication shown at 400B, no doping is performed at the second set of pixel cells, including pixel cells 405 and 410. The major doping direction 435 in 400A may be the same direction as the minor doping direction 490 in 400B, and the minor doping direction 440 in the fabrication process of pixel cell 400A may be the same direction as the major doping direction 485 in 400B. After applying major and minor doping to pixel cells 405 and 410 in 400A and major and minor doping to pixel cells 415 and 420 in 400B, all four pixel cells 405, 410, 415, 420 in the pixel cell unit have been doped.

Figure 5:
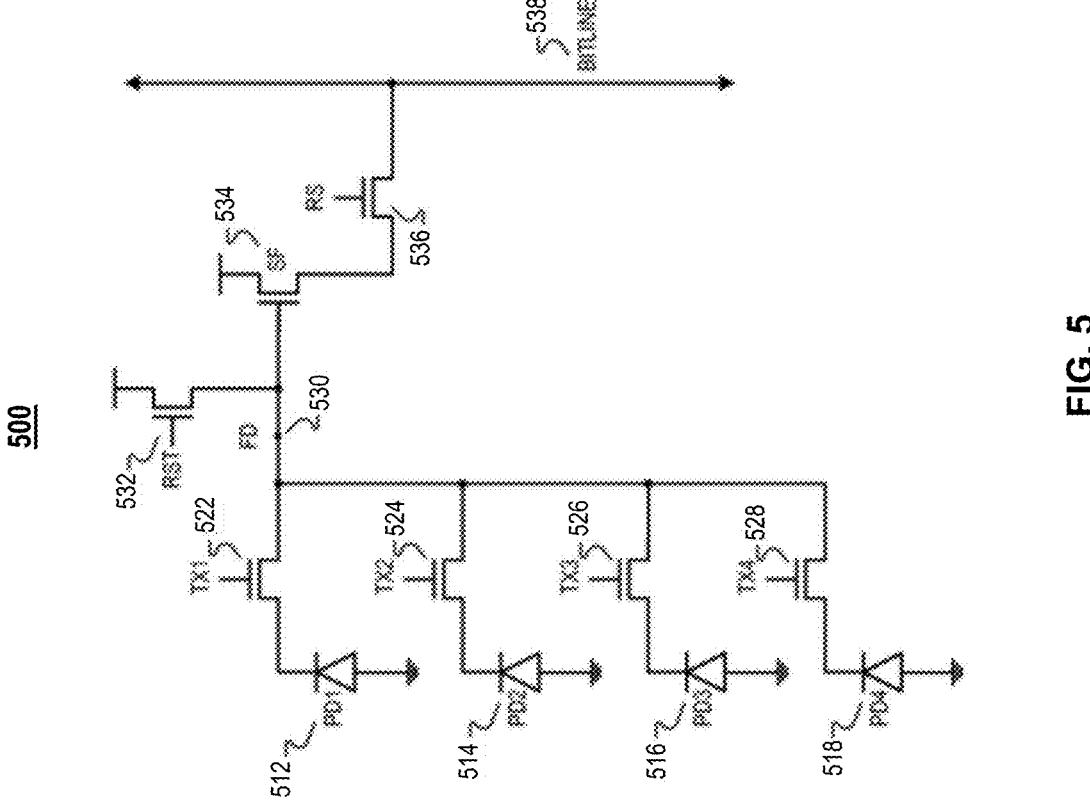
FIG. 5 shows a schematic illustrating an example of a pixel unit circuit in accordance with the teachings of the present disclosure.

To illustrate the use of a pixel unit such as pixel cell unit 300 or pixel cell unit 400A/B, FIG. 5 shows a schematic illustrating an example of a pixel cell unit 500 having transfer gates including doped regions described with respect to FIGS. 1, 2A, 2B, 3 and 4. A plurality of such pixel units can be arranged in pixel array. In the depicted example, pixel cell unit 500 is illustrated as being a four-pixel cells or four-transistor ("4T") pixel unit included in a backside illuminated image sensor in accordance with the teachings of the present disclosure. It is appreciated that pixel cell unit 500 is one possible example of pixel circuitry architecture for implementing each pixel unit within pixel array. However, it should be appreciated that other examples in accordance with the teachings of the present disclosure are not necessarily limited to 4T pixel architectures. One having ordinary skill in the art having the benefit of the present disclosure will understand that the present teachings are also applicable to 3T designs, 5T designs, and various other pixel architectures in accordance with the teachings of the present disclosure.

In the example depicted in FIG. 5, pixel cell unit 500 includes four pixel cells and one floating diffusion 530. Each pixel cell includes a photodiode and a transfer transistor. In the example of FIG. 5, the four pixel cells include the following photodiode to transfer transistor pairings: photodiode 512 and transfer transistor 522, photodiode 514 and transfer transistor 524, photodiode 516 and transfer transistor 526, and photodiode 518 and transfer transistor 528. Pixel unit 500 also includes a reset transistor 532, a floating diffusion ("FD") 530, a source-follower ("SF") transistor 534, and a select transistor 536. During operation, one or more of transfer transistors 522-528 receives a transfer signal during a transfer period causing a transfer of the image charge accumulated in the corresponding photodiodes 512-518 to floating diffusion 530. In some example embodiments, the floating diffusion 530 may be coupled to a storage capacitor for temporarily storing image charges.

As shown in the illustrated example of FIG. 5, reset transistor 532 is coupled between a power rail VDD and the floating diffusion 530 to reset the pixel cell unit 500 (e.g., discharge or charge the floating diffusion 530 and the photodiodes 512-518 to a preset voltage) in response to a reset signal RST. The floating diffusion 530 is coupled to control the gate of SF transistor 534. SF transistor 534 is coupled between the power rail VDD and select transistor 536. SF transistor 534 operates as a source-follower amplifier providing a high impedance connection to the floating diffusion 530. Select transistor 536 selectively couples the output of pixel unit 500 to the readout column bitline 538 in response to a select signal RS. Control circuitry can configure the TX signals TX1-TX4 controlling operations of transfer transistors 522-528, respectively, as well as the RST signal, and the select signal (RS). The control circuitry can control via the TX1-TX4 signals to transfer transistors 522-528 which of the photodiodes 512-518 are connected to the floating diffusion 530 during the transfer period according to the desired light sensitivity and needed dynamic range. For the lowest light levels, the control circuitry can cause all of the photodiodes 512-518 via control signals TX1-TX4 and transfer transistors 522-528 to be connected to the floating diffusion 530 during the transfer period. For higher light levels, fewer than all of the photodiodes 512-518 (e.g., one or more of 512-518) via control signals TX1-TX4 and transistors 522-528 to be connected to the floating diffusion 530 during the transfer period.

In some example embodiments, the pixel cell units are arranged into a two-dimensional (2D) pixel array of imaging sensors or pixel units. In some example embodiments, each pixel unit is a CMOS imaging pixel. It is noted that the pixel cell units in the pixel array may be examples of pixel cell unit 500 of FIG. 5 and/or of pixel cell unit 300 of FIG. 3. Each pixel unit can be arranged into a row (e.g., rows R1 to Ry) and a column (e.g., column C1 to Cx) to acquire image data of a person, place, object, etc., which can then be used to render a 2D image of the person, place, object, etc.

In some example embodiments, after each pixel cell unit has accumulated its image data or image charge, the image data is readout by readout circuitry through readout column bitlines 538 and then transferred to function logic. In various examples, the readout circuitry may include amplification circuitry, analog-to-digital (ADC) conversion circuitry, or otherwise. Function logic may simply store the image data or even manipulate the image data by applying post image effects (e.g., crop, rotate, remove red eye, adjust brightness, adjust contrast, or otherwise). In some example embodiments, the readout circuitry may readout a row of image data at a time along readout column bitlines 538 or may readout the image data using a variety of other techniques (not illustrated), such as a serial readout or a full parallel readout of all pixel cell units simultaneously.

Control circuitry may be coupled to pixel array to control operational characteristics of pixel array. For example, control circuitry may generate a shutter signal for controlling image acquisition. In one example, the shutter signal is a global shutter signal for simultaneously enabling all pixel units within pixel array to simultaneously capture their respective image data during a single acquisition window. In another example, the shutter signal is a rolling shutter signal such that each row, column, or group of pixel units is sequentially enabled during consecutive acquisition windows.

FIG. 6 shows an example process for producing the image sensor devices detailed in FIGS. 1, 2A, 2B, 3, 4, and 5. The process includes etching deep trenches in the semiconductor material, depositing a vertical transfer gate into the deep trenches, and applying a photoresist to first pixel cells and doping second pixel cells, followed by applying photoresist to the second pixel cells and doping the first pixel cells.

At 610, the process includes forming, for each pixel cell in the pixel cell array, a gate trench on a front side of a semiconductor material corresponding to vertical transfer gate position.

At 620, the process includes depositing, for each pixel cell in the pixel cell array, gate material into the gate trench to form a vertical transfer gate.

At 630, the process includes applying a first photoresist mask covering a region associated with a first set of pixel cells comprising a first pixel cell and a second pixel cell in the pixel cell array, and leaving second set of pixel cells exposed comprising a third pixel cell and a fourth pixel cell in the pixel array. The first pixel cell has a first transfer gate, the second pixel cell has a second transfer gate, the third pixel cell has a third transfer gate, and the fourth pixel cell has a fourth transfer gate. The first transfer gate is disposed between a first photodiode of the first pixel cell and a floating diffusion, the second transfer gate is disposed between a second photodiode of the second pixel cell and the floating diffusion, the third transfer gate is disposed between a third photodiode of the third pixel cell and the floating diffusion, and the fourth transfer gate is disposed between a fourth photodiode of the fourth pixel cell and the floating diffusion.

At 640, the process includes doping the semiconductor material to form passivation layers having regions with non-uniformly distributed doping profiles proximate to the respective vertical gate structures in third and fourth pixel cells that are not masked by the first photoresist mask. The non-uniformly distributed doping profiles include regions in the passivation layer having a first doping concentration proximate to the exposed respective vertical gate structures along a first direction and regions in the passivation layer having a second doping concentration proximate to the exposed respective vertical gate structures along a second direction. The second direction is parallel to a respective charge transfer path between a respective photodiode and the floating diffusion and the first direction intersects the respective charge transfer path. The first doping concentration is less than the second doping concentration.

At 650, the process includes removing the first photoresist mask to expose the first set of pixel cells comprising the first pixel cell and the second pixel cell of the pixel array, and applying a second photoresist mask to the second set of pixel cells comprising the third pixel cell and the fourth pixel cell in the pixel array.

At 660, the process includes doping the semiconductor material to form passivation layers having regions with non-uniformly distributed doping profiles proximate to the respective vertical gate structures in first and second pixel cells that are not masked by the second photoresist mask.

In some embodiments, the first doping concentration in the first direction that is less than the second doping concentration in the second direction configures a corresponding pixel cell to cause charge transfer through the semiconductor material in the second direction during a charge transfer time period. In some embodiments, the first doping concentration may be between 20% and 70% of the second doping concentration, and the doping the passivation layer may include p-type doping such as Boron.

The above description of illustrated examples of the disclosure, including what is described in the Abstract, is not intended to be exhaustive or to limit the disclosure to the precise forms disclosed. While specific examples of the disclosure are described herein for illustrative purposes, various modifications are possible within the scope of the disclosure, as those skilled in the relevant art will recognize.

These modifications can be made to the disclosure in light of the above detailed description. The terms used in the following claims should not be construed to limit the disclosure to the specific examples disclosed in the specification. Rather, the scope of the disclosure is to be determined entirely by the following claims, which are to be construed in accordance with established doctrines of claim interpretation.

What is claimed is:

1. A pixel cell, comprising:
a photodiode disposed in a semiconductor material;
a floating diffusion disposed in the semiconductor material;
a transfer gate comprising a vertical transfer gate structure disposed in the semiconductor material between the photodiode and the floating diffusion, the transfer gate coupled between the photodiode and the floating diffusion; and
a passivation layer disposed in the semiconductor material and proximate to the vertical transfer gate, wherein the passivation layer has a region with a non-uniformly distributed doping profile proximate to the vertical gate structure such that a first doping concentration of the region in the passivation layer proximate to the vertical gate structure along a first direction is less than a second doping concentration of the region in the passivation layer proximate to the vertical gate structure along a second direction, and wherein a cross-section of the region with the non-uniformly distributed doping profile proximate to the vertical gate structure has an oval shaped profile.

2. The pixel cell of claim 1, wherein the first doping concentration of the region in the passivation layer proximate to the vertical gate structure is along the first direction that intersects with a charge transfer path between the photodiode and the floating diffusion, and wherein the second doping concentration of the region in the passivation layer proximate to the vertical gate structure is along the second direction that is parallel to the charge transfer path.

3. The pixel cell of claim 1, wherein the first direction is orthogonal to the second direction.

4. The pixel cell of claim 1, wherein a major axis of the oval shaped profile is along the second direction, and wherein a minor axis of the oval shaped profile is along the first direction.

5. The pixel cell of claim 1, wherein the first doping concentration in the passivation layer proximate to the vertical gate structure along the first direction is between 20% and 70% of the second doping concentration in the passivation layer proximate to the vertical gate structure along the second direction.

6. The pixel cell of claim 1, wherein the passivation layer is a doped region having an opposite conductivity type as the photodiode.

7. The pixel cell of claim 6, wherein the passivation layer is doped with boron.

8. The pixel cell of claim 1, wherein:
the photodiode is one of a plurality of photodiodes disposed in the semiconductor material;
the transfer gate is one of a plurality of transfer gates disposed in the semiconductor material,
each of the plurality of transfer gates is disposed in the semiconductor material between a respective one of the plurality of photodiodes and the floating diffusion;
the passivation layer is one of a plurality of passivation layers disposed in the semiconductor material; and
each of the plurality of passivation layers is proximate to the vertical transfer gate of a respective one of the plurality of transfer gates.

9. A pixel cell, comprising:
a photodiode disposed in a semiconductor material;

a floating diffusion disposed in the semiconductor material;
a transfer gate comprising a vertical transfer gate structure disposed in the semiconductor material between the photodiode and the floating diffusion, the transfer gate coupled between the photodiode and the floating diffusion; and
a passivation layer disposed in the semiconductor material and proximate to the vertical transfer gate, wherein the passivation layer comprises doped material in the semiconductor material proximate to the vertical transfer gate and having a region with a non-uniformly distributed doping profile proximate to the vertical gate structure such that a first doping concentration of the region in the passivation layer proximate to the vertical gate structure along a first direction is less than a second doping concentration of the region in the passivation layer proximate to the vertical gate structure along a second direction, and wherein the doped material comprises:
a first doped region having the first doping concentration and surrounding the vertical transfer gate in the semiconductor material, wherein the first doped region has a first oval shaped profile with a major axis that intersects a charge transfer path between the photodiode and the floating diffusion; and
a second doped region having the second doping concentration and surrounding the vertical transfer gate in the semiconductor material, wherein the second doped region has a second oval shaped profile with a major axis that is parallel with charge transfer path, and wherein the second doping concentration is greater than the first doping concentration.

10. The pixel cell of claim 9, wherein the first doping concentration in the first doped region varies with respect to a distance from the charge transfer path.

11. The pixel cell of claim 9, wherein the first doping concentration in the passivation layer proximate to the vertical gate structure along the first direction is between 20% and 70% of the second doping concentration in the passivation layer proximate to the vertical gate structure along the second direction.

12. The pixel cell of claim 9, wherein the passivation layer is a doped region having an opposite conductivity type as the photodiode.

13. The pixel cell of claim 9, wherein the first direction is orthogonal to the second direction.

14. The pixel cell of claim 9, wherein:
the photodiode is one of a plurality of photodiodes disposed in the semiconductor material;
the transfer gate is one of a plurality of transfer gates disposed in the semiconductor material,
each of the plurality of transfer gates is disposed in the semiconductor material between a respective one of the plurality of photodiodes and the floating diffusion;
the passivation layer is one of a plurality of passivation layers disposed in the semiconductor material; and
each of the plurality of passivation layers is proximate to the vertical transfer gate of a respective one of the plurality of transfer gates.

15. An imaging system, comprising:
a pixel array having a plurality of pixel cells, each of the plurality of pixel cells comprising:
a floating diffusion disposed in a semiconductor material,
four pixels, each pixel comprising:

a photodiode disposed in a semiconductor material; and a transfer gate comprising a vertical transfer gate structure disposed in the semiconductor material between the photodiode and the floating diffusion, wherein the four pixels are coupled to the floating diffusion, and wherein at least two of the pixels have a different first direction and a different second direction, and a passivation layer disposed in the semiconductor material and proximate to the vertical transfer gate, wherein the passivation layer has a region with a non-uniformly distributed doping profile proximate to the vertical gate structure such that a first doping concentration of the region in the passivation layer proximate to the vertical gate structure along a first direction is less than a second doping concentration of the region in the passivation layer proximate to the vertical gate structure along a second direction; and control circuitry coupled to the pixel array to control operation of the pixel array.

16. The imaging system of claim 15, wherein each passivation layer is a doped region having an opposite conductivity type as the photodiode.

17. The imaging system of claim 15, wherein each passivation layer is doped with boron.

18. The imaging system of claim 15, wherein the first doping concentration in the first direction that is less than the second doping concentration in the second direction causes charge to be transferred through the semiconductor material along a charge transfer path parallel to the second direction during a charge transfer time period.

19. The imaging system of claim 15, wherein the first doping concentration is between 20% and 70% of the second doping concentration.

20. The imaging system of claim 15, wherein the passivation layer comprises doped material in the semiconductor material proximate to the vertical transfer gate, and wherein the doped material comprises:

a first doped region having the first doping concentration and surrounding the vertical transfer gate in the semiconductor material, wherein the first doped region has a first oval shaped profile with a major axis that intersects a charge transfer path between the photodiode and the floating diffusion; and a second doped region having the second doping concentration and surrounding the vertical transfer gate in the semiconductor material, wherein the second doped region has a second oval shaped profile with a major axis that is parallel with the charge transfer path, and wherein the second doping concentration is greater than the first doping concentration.

21. The imaging system of claim 20, wherein the first doping concentration of the first doped region varies with respect to a distance from the charge transfer path.

* * * * *